(12) United States Patent
Jindal

(10) Patent No.: US 11,022,876 B2
(45) Date of Patent: *Jun. 1, 2021

(54) EXTREME ULTRAVIOLET MASK BLANK WITH MULTILAYER ABSORBER AND METHOD OF MANUFACTURE

(71) Applicant: Applied Materials, Inc., Santa Clara, CA (US)

(72) Inventor: Vibhu Jindal, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/821,444

(22) Filed: Mar. 17, 2020

(65) Prior Publication Data

US 2020/0218145 A1 Jul. 9, 2020

Related U.S. Application Data

(63) Continuation of application No. 15/652,499, filed on Jul. 18, 2017, now Pat. No. 10,747,102.

(60) Provisional application No. 62/367,388, filed on Jul. 27, 2016.

(51) Int. Cl.
| | | |
|---|---|---|
| *G03F 1/58* | (2012.01) | |
| *G03F 1/24* | (2012.01) | |
| *G03F 1/52* | (2012.01) | |
| *G03F 1/60* | (2012.01) | |

(52) U.S. Cl.
CPC ............... *G03F 1/58* (2013.01); *G03F 1/24* (2013.01); *G03F 1/52* (2013.01); *G03F 1/60* (2013.01)

(58) Field of Classification Search
CPC ...... G03F 1/24; G03F 1/58; G03F 1/52; G03F 1/60
USPC .......................................................... 430/5
See application file for complete search history.

(56) References Cited

U.S. PATENT DOCUMENTS

| | | | |
|---|---|---|---|
| 5,641,593 | A | 6/1997 | Watanabe et al. |
| 6,013,399 | A | 1/2000 | Nguyen |
| 6,323,131 | B1 | 11/2001 | Obeng et al. |
| 6,818,361 | B2 | 11/2004 | Yan |
| 8,587,662 | B1 | 11/2013 | Moll |
| 8,691,476 | B2 | 4/2014 | Yu et al. |
| 8,802,335 | B2 | 8/2014 | Oh et al. |
| 8,932,785 | B2 | 1/2015 | Utzny |
| 9,329,597 | B2 | 5/2016 | Stoschek et al. |
| 9,612,522 | B2 | 4/2017 | Hassan et al. |

(Continued)

FOREIGN PATENT DOCUMENTS

| | | |
|---|---|---|
| EP | 3454119 A1 | 3/2019 |
| JP | 2007114336 A | 5/2007 |

(Continued)

OTHER PUBLICATIONS

Final Office Action in U.S. Appl. No. 16/229,659 dated Jul. 1, 2020, 10 pages.

(Continued)

*Primary Examiner* — John A McPherson
(74) *Attorney, Agent, or Firm* — Servilla Whitney LLC

(57) ABSTRACT

Extreme ultraviolet (EUV) mask blanks, methods for their manufacture and production systems therefor are disclosed. The EUV mask blanks comprise a multilayer stack of absorber layers on the capping layer, the multilayer stack of absorber layers including a plurality of absorber layer pairs.

20 Claims, 8 Drawing Sheets

(56) References Cited

U.S. PATENT DOCUMENTS

| | | | |
|---|---|---|---|
| 10,747,102 B2* | 8/2020 | Jindal | G03F 1/24 |
| 2003/0091910 A1 | 5/2003 | Schwarzl et al. | |
| 2003/0147058 A1 | 8/2003 | Murakami et al. | |
| 2003/0203289 A1 | 10/2003 | Yan et al. | |
| 2004/0151988 A1 | 8/2004 | Silverman | |
| 2004/0213971 A1 | 10/2004 | Colburn et al. | |
| 2005/0084773 A1 | 4/2005 | Krauth | |
| 2005/0208389 A1 | 9/2005 | Ishibashi et al. | |
| 2006/0029866 A1 | 2/2006 | Schwarzl et al. | |
| 2006/0251973 A1 | 11/2006 | Takaki et al. | |
| 2007/0020903 A1 | 1/2007 | Takehara et al. | |
| 2007/0090084 A1 | 4/2007 | Yan et al. | |
| 2008/0248409 A1 | 10/2008 | Ishibashi et al. | |
| 2009/0130569 A1 | 5/2009 | Quesnel | |
| 2010/0167181 A1 | 7/2010 | Kim | |
| 2011/0020737 A1 | 1/2011 | Kamo et al. | |
| 2011/0104595 A1 | 5/2011 | Hayashi et al. | |
| 2012/0088315 A1 | 4/2012 | Merelle et al. | |
| 2012/0129083 A1 | 5/2012 | Yoshimori et al. | |
| 2012/0322000 A1 | 12/2012 | Uno et al. | |
| 2013/0100428 A1 | 4/2013 | Ruoff et al. | |
| 2013/0162726 A1 | 6/2013 | Mizukami et al. | |
| 2013/0217238 A1 | 8/2013 | Boussie et al. | |
| 2013/0323626 A1 | 12/2013 | Chang | |
| 2014/0051015 A1 | 2/2014 | Gallagher | |
| 2014/0192335 A1 | 7/2014 | Hagio et al. | |
| 2014/0212794 A1 | 7/2014 | Maeshige et al. | |
| 2014/0218713 A1 | 8/2014 | Lu et al. | |
| 2014/0248555 A1 | 9/2014 | Chang et al. | |
| 2014/0254001 A1 | 9/2014 | Sun et al. | |
| 2014/0254018 A1 | 9/2014 | Sun et al. | |
| 2014/0254890 A1 | 9/2014 | Bergman | |
| 2014/0268080 A1 | 9/2014 | Beasley et al. | |
| 2014/0272681 A1 | 9/2014 | Huang et al. | |
| 2014/0272684 A1 | 9/2014 | Hofmann et al. | |
| 2015/0024305 A1 | 1/2015 | Lu et al. | |
| 2015/0064611 A1 | 3/2015 | Shin | |
| 2015/0205298 A1 | 7/2015 | Stoschek et al. | |
| 2015/0212402 A1 | 7/2015 | Patil | |
| 2015/0279635 A1 | 10/2015 | Subramani et al. | |
| 2016/0011499 A1 | 1/2016 | Hassan et al. | |
| 2016/0011500 A1 | 1/2016 | Hassan et al. | |
| 2016/0011502 A1 | 1/2016 | Hofmann et al. | |
| 2016/0147138 A1* | 5/2016 | Shih | G03F 1/54 430/5 |
| 2016/0196485 A1 | 7/2016 | Patterson et al. | |
| 2016/0357100 A1 | 12/2016 | Ikuta | |
| 2017/0062210 A1 | 3/2017 | Visser et al. | |
| 2017/0092533 A1 | 3/2017 | Chakraborty et al. | |
| 2017/0131627 A1 | 5/2017 | Hassan et al. | |
| 2017/0136631 A1 | 5/2017 | Li et al. | |
| 2017/0140920 A1 | 5/2017 | Arnepalli et al. | |
| 2017/0160632 A1 | 6/2017 | Hassan et al. | |
| 2017/0235217 A1* | 8/2017 | Qi | G03F 1/72 716/52 |
| 2017/0256402 A1 | 9/2017 | Kaufman-Osborn et al. | |
| 2017/0351169 A1 | 12/2017 | Yu et al. | |
| 2018/0031964 A1 | 2/2018 | Jindal | |
| 2018/0031965 A1 | 2/2018 | Jindal | |
| 2018/0120692 A1 | 5/2018 | Ikebe et al. | |
| 2019/0056653 A1 | 2/2019 | Kawahara et al. | |

FOREIGN PATENT DOCUMENTS

| | | | |
|---|---|---|---|
| JP | 2007273678 A | 10/2007 | |
| JP | 2009099931 A | 5/2009 | |
| JP | 2012503318 A | 2/2012 | |
| JP | 2013120868 A | 6/2013 | |
| KR | 20070036519 A | 4/2007 | |
| KR | 20080001023 A | 1/2008 | |
| KR | 100972863 B1 | 7/2010 | |
| KR | 20110050427 A | 5/2011 | |
| KR | 20110120785 A | 11/2011 | |
| KR | 20150056435 A | 5/2015 | |
| KR | 20160002332 A | 1/2016 | |
| KR | 20160143917 A | 12/2016 | |
| KR | 20170021190 A | 2/2017 | |
| WO | 2016007613 A1 | 1/2016 | |

OTHER PUBLICATIONS

PCT International Search Report and Written Opinion in PCT/US2020/016022 dated Jun. 5, 2020, 11 pages.
PCT International Search Report and Written Opinion in PCT/US2020/016023, dated Jun. 29, 2020, 11 pages.
PCT International Search Report and Written Opinion in PCT/US2020/020034 dated Jun. 23, 2020, 9 pages.
Extended European Search Report in EP15819417.5 dated Nov. 2, 2017, 11 pages.
Machine Translation of JP 2007114336, 23 pages.
Machine Translation of JP 2009099931, 18 pages.
Machine Translation of KR20070036519, 7 pages.
Non-Final Office Action in U.S. Appl. No. 14/620,114 dated Jul. 22, 2016, 15 pages.
Non-Final Office Action in U.S. Appl. No. 15/438,248 dated May 10, 2018, 15 pages.
Non-Final Office Action in U.S. Appl. No. 15/652,501 dated Apr. 20, 2020, 17 pages.
Non-Final Office Action in U.S. Appl. No. 15/652,501 dated Apr. 20, 2020, 7 pages.
PCT International Preliminary Report on Patentability in PCT/US2015/039525 dated Jan. 26, 2017, 9 pages.
PCT International Preliminary Report on Patentability in PCT/US2015/039533 dated Jan. 26, 2017, 10 pages.
PCT International Preliminary Report on Patentability in PCT/US2017/042747 dated Jul. 26, 2018, 10 pages.
PCT International Preliminary Report on Patentability in PCT/US2017/042748 dated Jul. 26, 2018, 10 pages.
PCT International Search Report and Written Opinion in PCT/US2015/039525 dated Sep. 18, 2015, 10 pages.
PCT International Search Report and Written Opinion in PCT/US2015/039533 dated Sep. 21, 2015, 11 pages.
PCT International Search Report and Written Opinion in PCT/US2017/042747 dated Nov. 2, 2017, 14 pages.
PCT International Search Report and Written Opinion in PCT/US2017/042748 dated Nov. 2, 2017, 15 pages.
PCT International Search Report and Written Opinion in PCT/US2019/042143 dated Oct. 29, 2019, 11 pages.
PCT International Search Report and Written Opinion in PCT/US2019/058013 dated Feb. 14, 2020, 12 pages.
PCT International Search Report and Written Opinion in PCT/US2020/016021 dated May 29, 2020, 11 pages.
PCT International Search Report and Written Opinion PCT/US2018/067108 dated May 27, 2019, 13 pages.
Braun, Stefan , et al., "Multi-component EUV multilayer mirrors", Proc. of SPIE, vol. 5037 (2003), pp. 274-285.
Herregods, Sebastiaan J.F., et al., "Vapour phase self-assembled monolayers for ALD blocking on 300 mm wafer scale, 3 pages".
Jadhav, Sushilkumar A., "Self-assembled monolayers (SAMs) of carboxylic acids: an overview", Central European Journal of Chemistry, pp. 369-378.
Snow, A. W., et al., "Packing density of $HS(CH_2)nCOOH$ self-assembled monolayers", Analyst, 2011, 136, 4935, 4935-4949.
Zon, Jerzy , et al., "Synthesis of Phosphonic Acids and Their Esters as Possible Substrates for Reticular Chemistry", 2012, RCS publishing, Chapter 6, total pp. 36. (Year: 2012).
U.S. Appl. No. 16/861,788, filed Oct. 12, 2020, 33 pages.
PCT International Search Report and Written Opinion in PCT/US2020/033718 dated Sep. 9, 2020, 12 pages.
PCT International Search Report and Written Opinion in PCT/US2020/033719 dated Sep. 9, 2020, 12 pages.
PCT International Search Report and Written Opinion in PCT/US2020/033722 dated Sep. 1, 2020, 11 pages.
PCT International Search Report and Written Opinion in PCT/US2020/033723 dated Aug. 28, 2020, 12 pages.

(56) References Cited

OTHER PUBLICATIONS

PCT International Search Report and Written Opinion in PCT/US2020/033724 dated Sep. 9, 2020, 11 pages.
PCT International Search Report and Written Opinion in PCT/US2020/033725 dated Aug. 28, 2020, 11 pages.
PCT International Search Report and Written Opinion in PCT/US2020/033728 dated Aug. 28, 2020, 11 pages.
PCT International Search Report and Written Opinion in PCT/US2020/033729 dated Sep. 9, 2020, 11 pages.

* cited by examiner

EXTREME ULTRAVIOLET MASK BLANK WITH MULTILAYER ABSORBER AND METHOD OF MANUFACTURE

CROSS-REFERENCE TO RELATED APPLICATIONS

This application is a continuation of U.S. Non-Provisional application Ser. No. 15/652,499, filed Jul. 18, 2017, which claims the benefit of U.S. Provisional Application No. 62/367,388, filed Jul. 27, 2016, to each of which priority is claimed and each of which are incorporated herein by reference in their entireties.

TECHNICAL FIELD

The present disclosure relates generally to extreme ultraviolet lithography, and more particularly extreme ultraviolet mask blanks with a multilayer absorber and methods of manufacture.

BACKGROUND

Extreme ultraviolet (EUV) lithography, also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

FIG. 1 shows a conventional EUV reflective mask 10, which is formed from an EUV mask blank, which includes a reflective multilayer stack 12 on a substrate 14, which reflects EUV radiation at unmasked portions by Bragg interference. Masked (non-reflective) areas 16 of the EUV reflective mask 10 are formed by etching buffer layer 18 and absorbing layer 20. The absorbing layer typically has a thickness in a range of 51 nm to 77 nm. A capping layer 22 is formed over the reflective multilayer stack 12 and protects the multilayer stack 12 during the etching process. As will be discussed further below, EUV mask blanks are made of on a low thermal expansion material substrate coated with multilayers, capping layer and an absorbing layer, which is then etched to provide the masked (non-reflective) areas 16 and reflective areas 24.

The International Technology Roadmap for Semiconductors (ITRS) specifies a node's overlay requirement as some percentage of a technology's minimum half-pitch feature size. Due to the impact on image placement and overlay errors inherent in all reflective lithography systems, EUV reflective masks will need to adhere to more precise flatness specifications for future production. Additionally, reduction of three-dimensional (3D) mask effects is extremely challenging with EUV lithography using EUV reflective masks having a multilayer reflector and an absorber layer. There is a need to provide EUV mask blanks and methods of making EUV mask blanks used to make EUV reflective masks and mirrors that will enable the reduction of overlay errors and 3D mask effects.

SUMMARY

One or more embodiments of the disclosure are directed to a method of manufacturing an extreme ultraviolet (EUV) mask blank comprising providing a substrate; forming a multilayer stack of reflective layers on the substrate, the multilayer stack including a plurality of reflective layer pairs; forming a capping layer on the multilayer stack; and forming a multilayer stack of absorber layers on the capping layer, the multilayer stack of absorber layers including a plurality of absorber layer pairs, each pair comprising two different absorber materials having extinction coefficient (k) values that are different and index of refraction values (n) that are different.

Additional embodiments of the disclosure are directed to an extreme ultraviolet (EUV) mask blank comprising a substrate; a multilayer stack on the substrate, stack of reflective layers on the substrate, the multilayer stack including a plurality of reflective layer pairs; a capping layer on the multilayer stack; and a multilayer stack of absorber layers on the capping layer, the multilayer stack of absorber layers including a plurality of absorber layer pairs, each pair comprising two different absorber materials having extinction coefficient (k) values that are different and index of refraction values (n) that are different.

Further embodiments of the disclosure are directed to an extreme ultraviolet (EUV) mask blank production system comprising a substrate handling vacuum chamber for creating a vacuum; a substrate handling platform, in the vacuum, for transporting an ultra-low expansion substrate loaded in the substrate handling vacuum chamber; and multiple sub-chambers, accessed by the substrate handling platform, for forming an EUV mask blank including a multilayer stack on the substrate, stack of reflective layers on the substrate, the multilayer stack including a plurality of reflective layer pairs; a capping layer on the multilayer stack; and a multilayer stack of absorber layers on the capping layer, the multilayer stack of absorber layers including a plurality of absorber layer pairs, each pair comprising two different absorber materials having extinction coefficient (k) values that are different and index of refraction values (n) that are different.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Those skilled in the art will understand that the use of ordinals such as "first" and "second" to describe process regions do not imply a specific location within the processing chamber, or order of exposure within the processing chamber.

Figure 1:
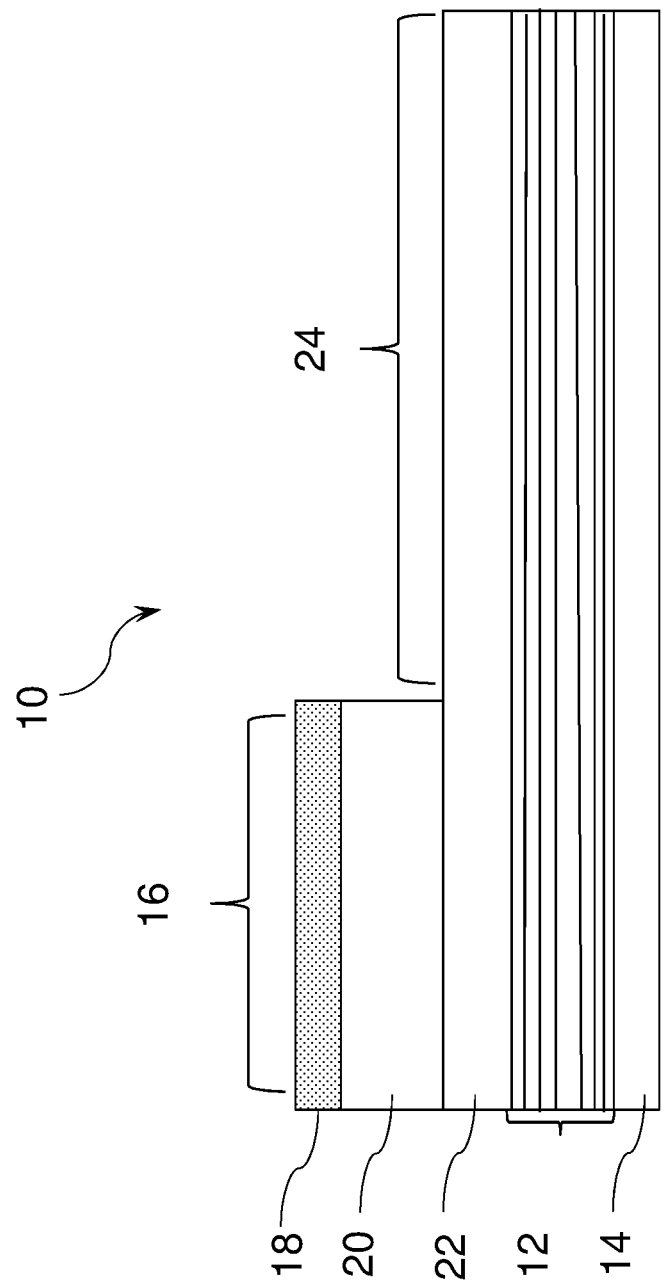
FIG. 1 schematically illustrates a background art EUV reflective mask employing a conventional absorber.
Figure 2:
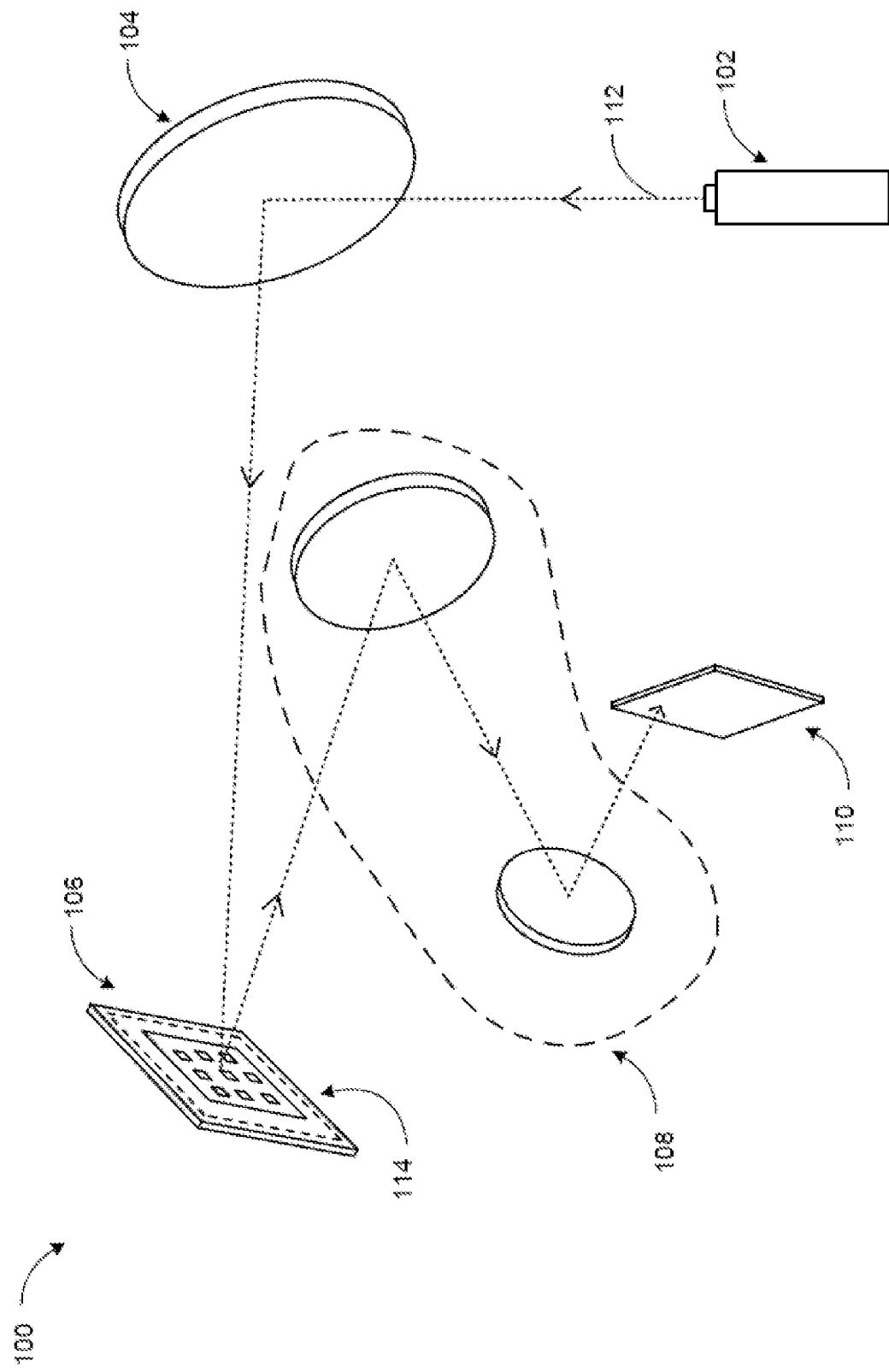
FIG. 2 schematically illustrates an embodiment of an extreme ultraviolet lithography system.

Referring now to FIG. 2, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof.

The extreme ultraviolet light source 102 generates the extreme ultraviolet light 112 having a variety of characteristics. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106.

Although the condenser 104 is shown as a single element, it is understood that the condenser 104 can include one or more reflective elements such as concave mirrors, convex mirrors, flat mirrors, or a combination thereof, for reflecting and concentrating the extreme ultraviolet light 112. For example, the condenser 104 can be a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 can include mirrors and other optical elements to reduce the size of the image of the mask pattern 114. For example, the optical reduction assembly 108 can include concave mirrors for reflecting and focusing the extreme ultraviolet light 112.

The optical reduction assembly 108 reduces the size of the image of the mask pattern 114 on the target wafer 110. For example, the mask pattern 114 can be imaged at a 4:1 ratio by the optical reduction assembly 108 on the target wafer 110 to form the circuitry represented by the mask pattern 114 on the target wafer 110. The extreme ultraviolet light 112 can scan the reflective mask 106 synchronously with the target wafer 110 to form the mask pattern 114 on the target wafer 110.

Figure 3:
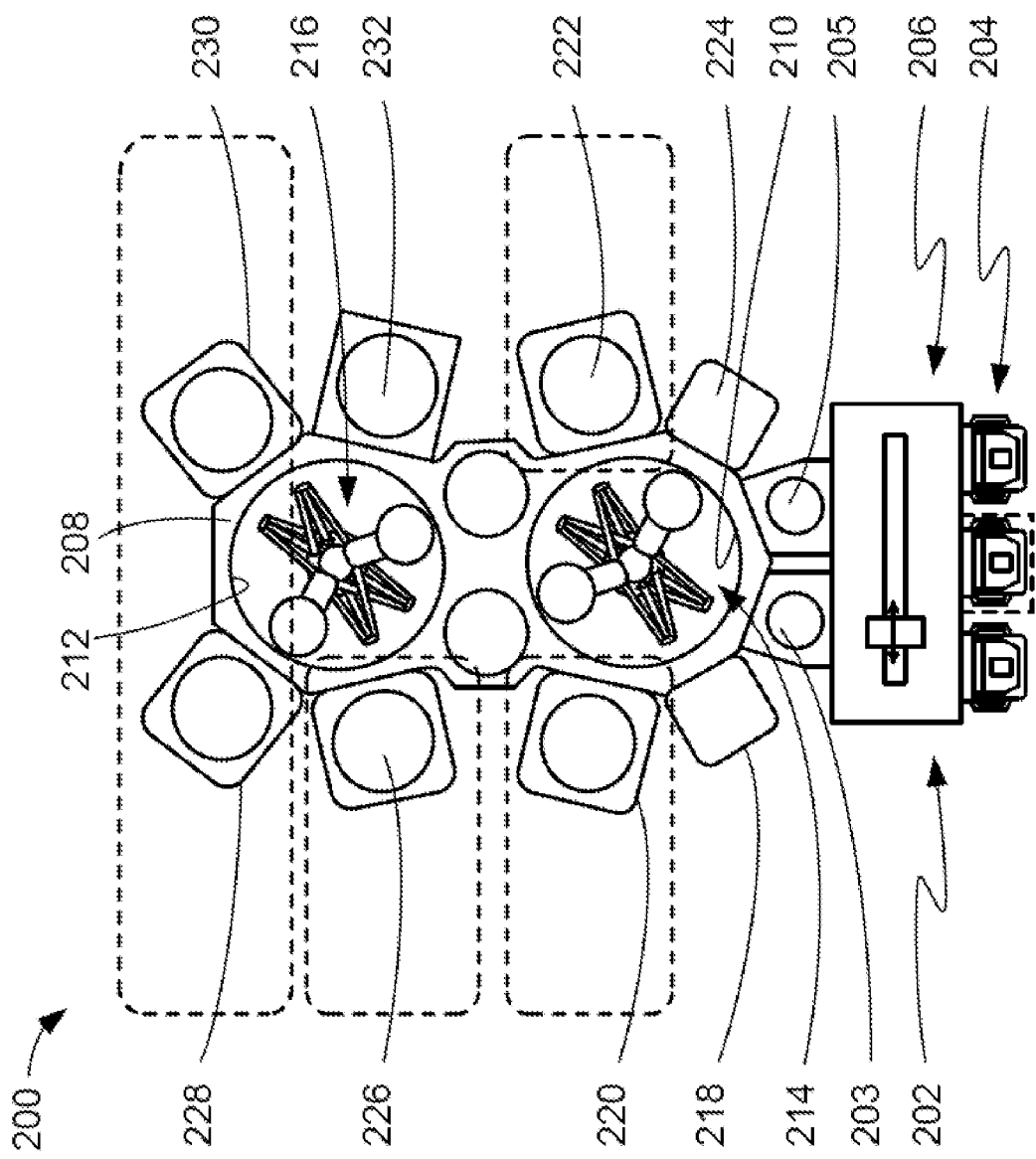
FIG. 3 illustrates an embodiment of an extreme ultraviolet reflective element production system.

Referring now to FIG. 3, an embodiment of of an extreme ultraviolet reflective element production system 200 is shown. The extreme ultraviolet reflective element includes a EUV mask blank 204, an extreme ultraviolet (EUV) mirror 205, or other reflective element such as an EUV reflective mask 106.

The extreme ultraviolet reflective element production system 200 can produce mask blanks, mirrors, or other elements that reflect the extreme ultraviolet light 112 of FIG. 2. The extreme ultraviolet reflective element production system 200 fabricates the reflective elements by applying thin coatings to source substrates 203.

The EUV mask blank 204 is a multilayered structure for forming the EUV reflective mask 106 of FIG. 2. The EUV mask blank 204 can be formed using semiconductor fabrication techniques. The EUV reflective mask 106 can have the mask pattern 114 of FIG. 2 formed on the mask blank 204 by etching and other processes.

The extreme ultraviolet mirror 205 is a multilayered structure reflective in a range of extreme ultraviolet light. The extreme ultraviolet mirror 205 can be formed using semiconductor fabrication techniques. The EUV mask blank 204 and the extreme ultraviolet mirror 205 can be similar structures with respect to the layers formed on each element, however the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 can include substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 can contain two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system can have any number of vacuum chambers.

The wafer handling vacuum chamber 208 can have a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, can be used to form thin films of conductive materials on the source substrates 203. For example, the physical vapor deposition systems can include vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

The physical vapor deposition system forms reflective layers, capping layers, and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 can include a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 can be in a separate system from the extreme ultraviolet reflective element production system 200.

The chemical vapor deposition system 228 can form thin films of material on the source substrates 203. For example, the chemical vapor deposition system 228 can be used to form layers of materials on the source substrates 203 including mono-crystalline layers, polycrystalline layers, amorphous layers, epitaxial layers, or a combination thereof. The chemical vapor deposition system 228 can form layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system can form planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 can transfer the source substrates 203 and the EUV mask blank 204 between the first wafer handling system 214, the second wafer handling system 216 in a continuous vacuum.

Figure 4:
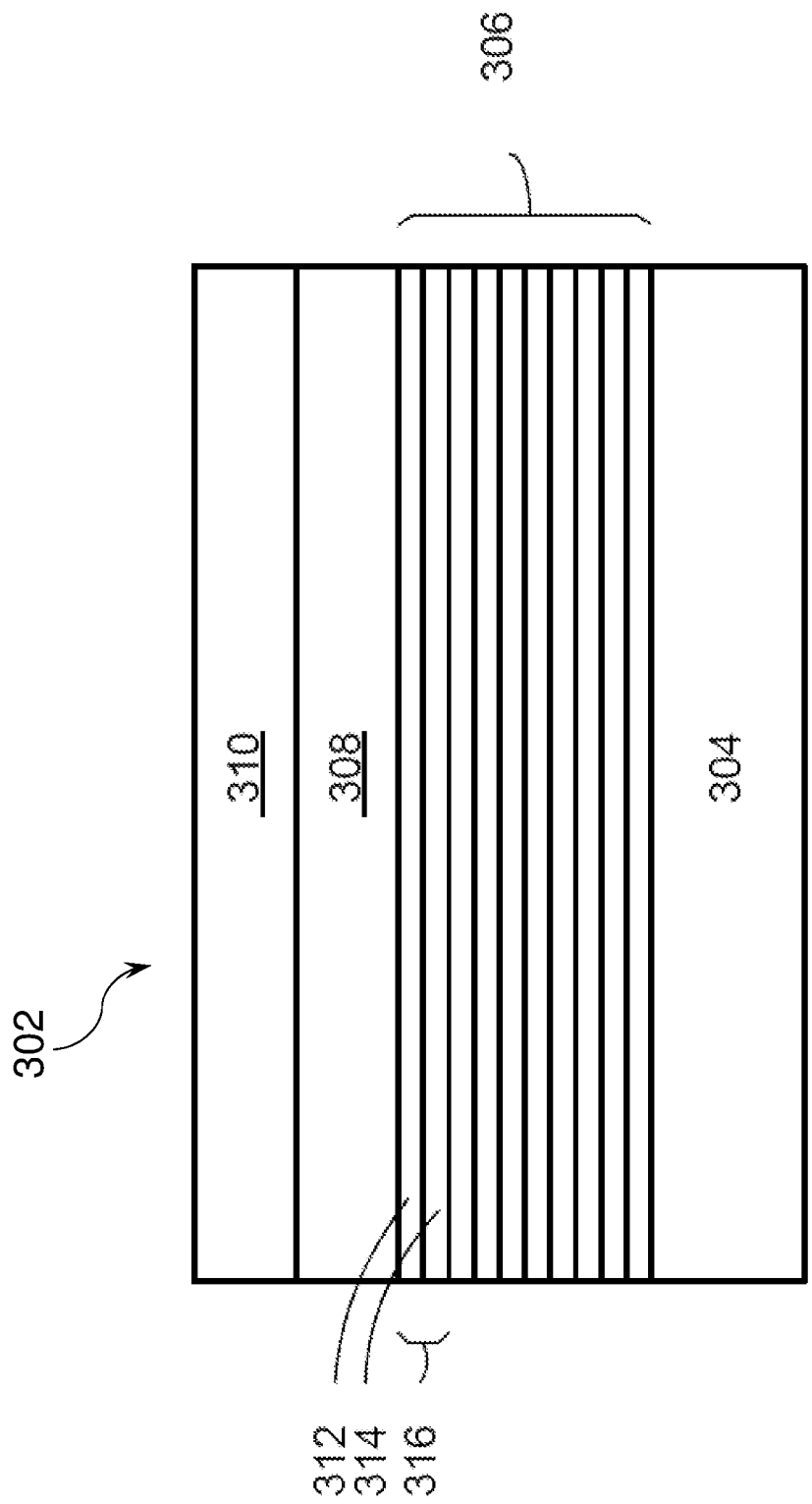
FIG. 4 illustrates an embodiment of an extreme ultraviolet reflective element such as an EUV mask blank.

Referring now to FIG. 4, an embodiment of an extreme ultraviolet reflective element 302 is shown. In one or more embodiments, the extreme ultraviolet reflective element 302 is the EUV mask blank 204 of FIG. 3 or the extreme ultraviolet mirror 205 of FIG. 3. The EUV mask blank 204 and the extreme ultraviolet mirror 205 are structures for reflecting the extreme ultraviolet light 112 of FIG. 2. The EUV mask blank 204 can be used to form the EUV reflective mask 106 shown in FIG. 2.

The extreme ultraviolet reflective element 302 includes a substrate 304, a multilayer stack 306 of reflective layers, and a capping layer 308. In one or more embodiments, the extreme ultraviolet mirror 205 is used to form reflecting structures for use in the condenser 104 of FIG. 2 or the optical reduction assembly 108 of FIG. 2.

The extreme ultraviolet reflective element 302, which can be a EUV mask blank 204, includes the substrate 304, the multilayer stack 306 of reflective layers, the capping layer 308, and an absorber layer 310. The extreme ultraviolet reflective element 302 can be a EUV mask blank 204, which is used to form the reflective mask 106 of FIG. 2 by patterning the absorber layer 310 with the layout of the circuitry required.

In the following sections, the term for the EUV mask blank 204 is used interchangeably with the term of the extreme ultraviolet mirror 205 for simplicity. In one or more embodiments, the mask blank 204 includes the components of the extreme ultraviolet mirror 205 with the absorber layer 310 added in addition to form the mask pattern 114 of FIG. 2.

The EUV mask blank 204 is an optically flat structure used for forming the reflective mask 106 having the mask pattern 114. In one or more embodiments, the reflective surface of the EUV mask blank 204 forms a flat focal plane for reflecting the incident light, such as the extreme ultraviolet light 112 of FIG. 2.

The substrate 304 is an element for providing structural support to the extreme ultraviolet reflective element 302. In one or more embodiments, the substrate 304 is made from a material having a low coefficient of thermal expansion (CTE) to provide stability during temperature changes. In one or more embodiments, the substrate 304 has properties such as stability against mechanical cycling, thermal cycling, crystal formation, or a combination thereof. The substrate 304 according to one or more embodiments is formed from a material such as silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314.

The first reflective layer 312 and the second reflective layer 314 forms a reflective pair 316 of FIG. 4. In a non-limiting embodiment, the multilayer stack 306 includes a range of 20-60 of the reflective pairs 316 for a total of up to 120 reflective layers.

The first reflective layer 312 and the second reflective layer 314 can be formed from a variety of materials. In an embodiment, the first reflective layer 312 and the second reflective layer 314 are formed from silicon and molybdenum, respectively. Although the layers are shown as silicon and molybdenum, it is understood that the alternating layers can be formed from other materials or have other internal structures.

The first reflective layer 312 and the second reflective layer 314 can have a variety of structures. In an embodiment, both the first reflective layer 312 and the second reflective layer 314 are formed with a single layer, multiple layers, a divided layer structure, non-uniform structures, or a combination thereof.

Because most materials absorb light at extreme ultraviolet wavelengths, the optical elements used are reflective instead of the transmissive as used in other lithography systems. The multilayer stack 306 forms a reflective structure by having alternating thin layers of materials with different optical properties to create a Bragg reflector or mirror.

In an embodiment, each of the alternating layers has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the alternating layers are about 6.5 nm thick. It is understood that the sizes and dimensions provided are within normal engineering tolerances for typical elements.

The multilayer stack 306 can be formed in a variety of ways. In an embodiment, the first reflective layer 312 and the second reflective layer 314 are formed with magnetron sputtering, ion sputtering systems, pulsed laser deposition, cathode arc deposition, or a combination thereof.

In an illustrative embodiment, the multilayer stack 306 is formed using a physical vapor deposition technique, such as magnetron sputtering. In an embodiment, the first reflective layer 312 and the second reflective layer 314 of the multilayer stack 306 have the characteristics of being formed by the magnetron sputtering technique including precise thickness, low roughness, and clean interfaces between the layers. In an embodiment, the first reflective layer 312 and the second reflective layer 314 of the multilayer stack 306 have the characteristics of being formed by the physical vapor deposition including precise thickness, low roughness, and clean interfaces between the layers.

The physical dimensions of the layers of the multilayer stack 306 formed using the physical vapor deposition technique can be precisely controlled to increase reflectivity. In an embodiment, the first reflective layer 312, such as a layer of silicon, has a thickness of 4.1 nm. The second reflective layer 314, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm can be reduced.

In an embodiment, the multilayer stack 306 has a reflectivity of greater than 60%. In an embodiment, the multilayer stack 306 formed using physical vapor deposition has a reflectivity in a range of 66%-67%. In one or more embodiments, forming the capping layer 308 over the multilayer stack 306 formed with harder materials improves reflectivity. In some embodiments, reflectivity greater than 70% is achieved using low roughness layers, clean interfaces between layers, improved layer materials, or a combination thereof.

In one or more embodiments, the capping layer 308 is a protective layer allowing the transmission of the extreme ultraviolet light 112. In an embodiment, the capping layer 308 is formed directly on the multilayer stack 306. In one or more embodiments, the capping layer 308 protects the multilayer stack 306 from contaminants and mechanical damage. In one embodiment, the multilayer stack 306 is sensitive to contamination by oxygen, carbon, hydrocarbons, or a combination thereof. The capping layer 308 according to an embodiment interacts with the contaminants to neutralize them.

In one or more embodiments, the capping layer 308 is an optically uniform structure that is transparent to the extreme ultraviolet light 112. The extreme ultraviolet light 112 passes through the capping layer 308 to reflect off of the multilayer stack 306. In one or more embodiments, the capping layer 308 has a total reflectivity loss of 1% to 2%. In one or more embodiments, each of the different materials has a different reflectivity loss depending on thickness, but all of them will be in a range of 1% to 2%.

In one or more embodiments, the capping layer 308 has a smooth surface. For example, the surface of the capping layer 308 can have a roughness of less than 0.2 nm RMS (root mean square measure). In another example, the surface of the capping layer 308 has a roughness of 0.08 nm RMS for a length in a range of 1/100 nm and 1/1 µm. The RMS roughness will vary depending on the range it is measured over. For the specific range of 100 nm to 1 micron that roughness is 0.08 nm or less. Over a larger range the roughness will be higher.

The capping layer 308 can be formed in a variety of methods. In an embodiment, the capping layer 308 is formed on or directly on the multilayer stack 306 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 308 has the physical characteristics of being formed by the magnetron sputtering technique including precise thickness, low roughness, and clean interfaces between the layers. In an embodiment, the capping layer 308 has the physical characteristics of being formed by the physical vapor deposition including precise thickness, low roughness, and clean interfaces between the layers.

In one or more embodiments, the capping layer 308 is formed from a variety of materials having a hardness sufficient to resist erosion during cleaning. In one embodiment, ruthenium is used as a capping layer material because it is a good etch stop and is relatively inert under the operating conditions. However, it is understood that other materials can be used to form the capping layer 308. In specific embodiments, the capping layer 308 has a thickness of in a range of 2.5 and 5.0 nm.

In one or more embodiments, the absorber layer 310 is a layer that absorbs the extreme ultraviolet light 112. In an embodiment, the absorber layer 310 is used to form the pattern on the reflective mask 106 by providing areas that do not reflect the extreme ultraviolet light 112. The absorber layer 310, according to one or more embodiments, comprises a material having a high absorption coefficient for a particular frequency of the extreme ultraviolet light 112, such as about 13.5 nm. In an embodiment, the absorber layer 310 is formed directly on the capping layer 308, and the absorber layer 310 is etched using a photolithography process to form the pattern of the reflective mask 106.

According to one or more embodiments, the extreme ultraviolet reflective element 302, such as the extreme ultraviolet mirror 205, is formed with the substrate 304, the multilayer stack 306, and the capping layer 308. The extreme ultraviolet mirror 205 has an optically flat surface and can efficiently and uniformly reflect the extreme ultraviolet light 112.

According to one or more embodiments, the extreme ultraviolet reflective element 302, such as the EUV mask blank 204, is formed with the substrate 304, the multilayer stack 306, the capping layer 308, and the absorber layer 310. The mask blank 204 has an optically flat surface and can efficiently and uniformly reflect the extreme ultraviolet light 112. In an embodiment, the mask pattern 114 is formed with the absorber layer 310 of the mask blank 204.

According to one or more embodiments, forming the absorber layer 310 over the capping layer 308 increases reliability of the reflective mask 106. The capping layer 308 acts as an etch stop layer for the absorber layer 310. When the mask pattern 114 of FIG. 2 is etched into the absorber layer 310, the capping layer 308 beneath the absorber layer 310 stops the etching action to protect the multilayer stack 306.

Figure 5:
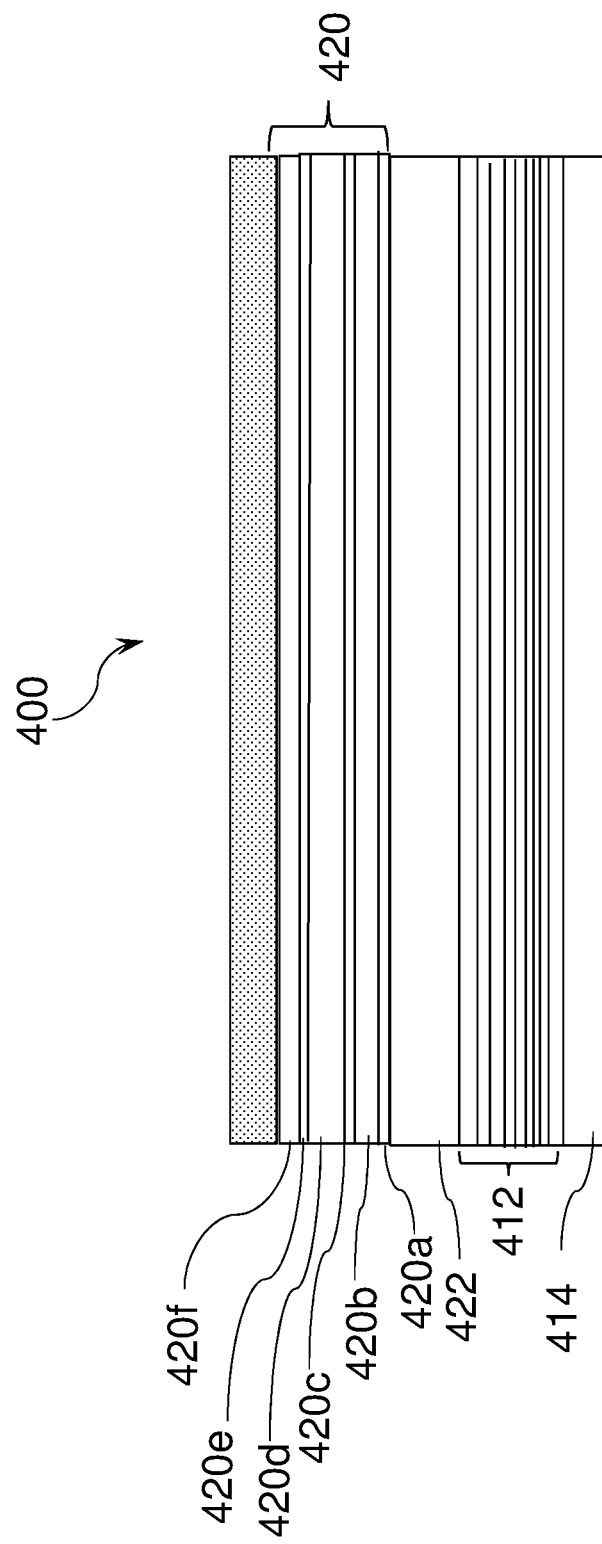
FIG. 5 illustrates an embodiment of an extreme ultraviolet reflective element such as an EUV mask blank.

Referring now to FIG. 5, an extreme ultraviolet (EUV) mask blank 400 is shown as comprising a substrate 414, a multilayer stack of reflective layers 412 on the substrate 414, the multilayer stack of reflective layers 412 including a plurality of reflective layer pairs. The EUV mask blank 400 further includes a capping layer 422 on the multilayer stack of reflective layers 412, and there is a multilayer stack 420 of absorber layers 420 on the capping layer 422. The multilayer stack 420 of absorber layers including a plurality of absorber layer pairs 420a, 420b, 420c, 420d, 420e, 420f, each pair (420a/420b, 420c/420d, 420e/420f) comprising two different absorber materials having extinction coefficient (k) values that are different and index of refraction values (n) that are different. For example, absorber layer 420a is made from a material that has an extinction coefficient value (k) that is different from the extinction coefficient value (k) of the material that forms absorber layer 420b. Likewise, absorber layer 420c is made from a material that has an extinction coefficient value (k) that is different from the extinction coefficient value (k) of the material that forms absorber layer 420d, and absorber layer 420e is made from a material that has an extinction coefficient value (k) that is different from the extinction coefficient value (k) of the material that forms absorber layer 420f. Furthermore, absorber layer 420a is made from a material that has an index of refraction values (n) that is different from the index of refraction values (n) of the material that forms absorber layer 420b. Likewise, absorber layer 420c is made from a material that has an index of refraction values (n) that is different from the index of refraction values (n) of the material that forms absorber layer 420d, and absorber layer 420e is made from a material that has an index of refraction values (n) that is different from the index of refraction values (n) of the material that forms absorber layer 420f.

In one embodiment, the extreme ultraviolet mask blank 400 includes the plurality of reflective layers 412 are selected from molybdenum (Mo) containing material and silicon (Si) containing material, for example, molybdenum (Mo) and silicon (Si). The absorber materials that are used to form the absorber layers 420a, 420b, 420c, 420d, 420e and 420f are selected from the group consisting of platinum (Pt), zinc (Zn), gold (Au), nickel oxide (NiO), silver oxide (Ag$_2$O), iridium (Ir), iron (Fe), tin dioxide (SnO$_2$), cobalt (Co), chromium nickel alloys, Ni$_8$Cr$_2$, tin oxide (SnO), copper (Cu), silver (Ag), actinium (Ac), tellurium (Te), caesium iodide (CsI), tin (Sn), zinc telluride (ZnTe), antimony (Sb), tantalum (Ta), tantalum nitride (TaN), tantalum nitride oxide (TaNO), chromium (Cr), chromium nitride (CrN) and tantalum borate (TaBO).

In one or more embodiments, wherein the absorber layer pairs 420a/420b, 420c/420d, 420e/420f comprise a first layer (420a, 420c, 420e) including an absorber material selected from the group consisting of tantalum (Ta), tantalum nitride (TaN), tantalum nitride oxide (TaNO), tantalum borate (TaBO) and a second layer (420b, 420d, 420f) including an absorber material selected from the group consisting of platinum (Pt), zinc (Zn), gold (Au), nickel oxide (NiO), silver oxide (Ag$_2$O), iridium (Ir), iron (Fe), tin dioxide (SnO$_2$), cobalt (Co), chromium nickel alloys, in particular Ni$_8$Cr$_2$, tin oxide (SnO), copper (Cu), silver (Ag), actinium (Ac), tellurium (Te), caesium iodide (CsI), tin (Sn), zinc telluride (ZnTe), chromium (Cr), chromium nitride (CrN) and antimony (Sb). In specific embodiments, the absorber layer pairs comprise a first layer (420a, 420c, 420e) including an absorber material selected from tantalum nitride (TaN) and a second layer (420b, 420d, 420f) including an absorber material selected from nickel (Ni).

According to one or more embodiments, the absorber layer pairs comprise a first layer (420a, 420c, 420e) and a second absorber layer (420b, 420d, 420f) each of the first absorber layers (420a, 420c, 420e) and second absorber layer (420b, 420d, 420f) have a thickness in a range of 0.1 nm and 10 nm, for example in a range of 1 nm and 5 nm, or in a range of 1 nm and 3 nm. In one or more specific embodiments, the thickness of the first layer 420a is 0.5 nm, 0.6 nm, 0.7 nm, 0.8 nm, 0.9 nm, 1 nm, 1.1 nm, 1.2 nm, 1.3 nm, 1.4 nm, 1.5 nm, 1.6 nm, 1.7 nm, 1.8 nm, 1.9 nm, 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, 4.1 nm, 4.2 nm, 4.3 nm, 4.4 nm, 4.5 nm, 4.6 nm, 4.7 nm, 4.8 nm, 4.9 nm, and 5 nm. In one or more embodiments, the thickness of the first absorber layer and second absorber layer of each pair is the same different. For example, the first absorber layer and second absorber layer have a thickness such that there is a ratio of the first absorber layer thickness to second absorber layer thickness of 1:1, 1.5:1, 2:1, 2.5:1, 3:1, 3.5:1, 4:1, 4.5:1, 5:1, 6:1, 7:1, 8:1, 9:1, 10:1, 11:1, 12:1, 13:1, 14:1, 15:1, 16:1, 17:1, 18:1, 19:1, or 20:1, which results in the first absorber layer having a thickness that is equal to greater than the second absorber layer thickness in each pair. Alternatively, the first absorber layer and second absorber layer have a thickness such that there is a ratio of the second absorber layer thickness to first absorber layer thickness of 1.5:1, 2:1, 2.5:1, 3:1, 3.5:1, 4:1, 4.5:1, 5:1, 6:1, 7:1, 8:1, 9:1, 10:1, 11:1, 12:1, 13:1, 14:1, 15:1, 16:1, 17:1, 18:1, 19:1, or 20:1 which results in the second absorber layer having a thickness that is equal to greater than the first absorber layer thickness in each pair.

According to one or more embodiments, the different absorber materials and thickness of the absorber layers are selected so that extreme ultraviolet light is absorbed due to absorbance and due to a phase change caused by destructive interfere with light from the multilayer stack of reflective layers. While the embodiment shown in FIG. shows three absorber layer pairs, 420a/420b, 420c/420d and 420e/420f, the claims should not be limited to a particular number of absorber layer pairs. According to one or more embodiments, the EUV mask blank 400 can include in a range of 5 and 60 absorber layer pairs or in a range of 10 and 40 absorber layer pairs.

According to one or more embodiments, the absorber layers have a thickness which provides less than 2% reflectivity and other etch properties. A supply gas can be used to further modify the material properties of the absorber layers, for example, nitrogen ($N_2$) gas can be used to form nitrides of the materials provided above. The multilayer stack of absorber layers according to one or more embodiments is a repetitive pattern of individual thickness of different materials so that the EUV light not only gets absorbed due to absorbance but by the phase change caused by multilayer absorber stack, which will destructively interfere with light from multilayer stack reflective materials beneath to provide better contrast.

Figure 6:
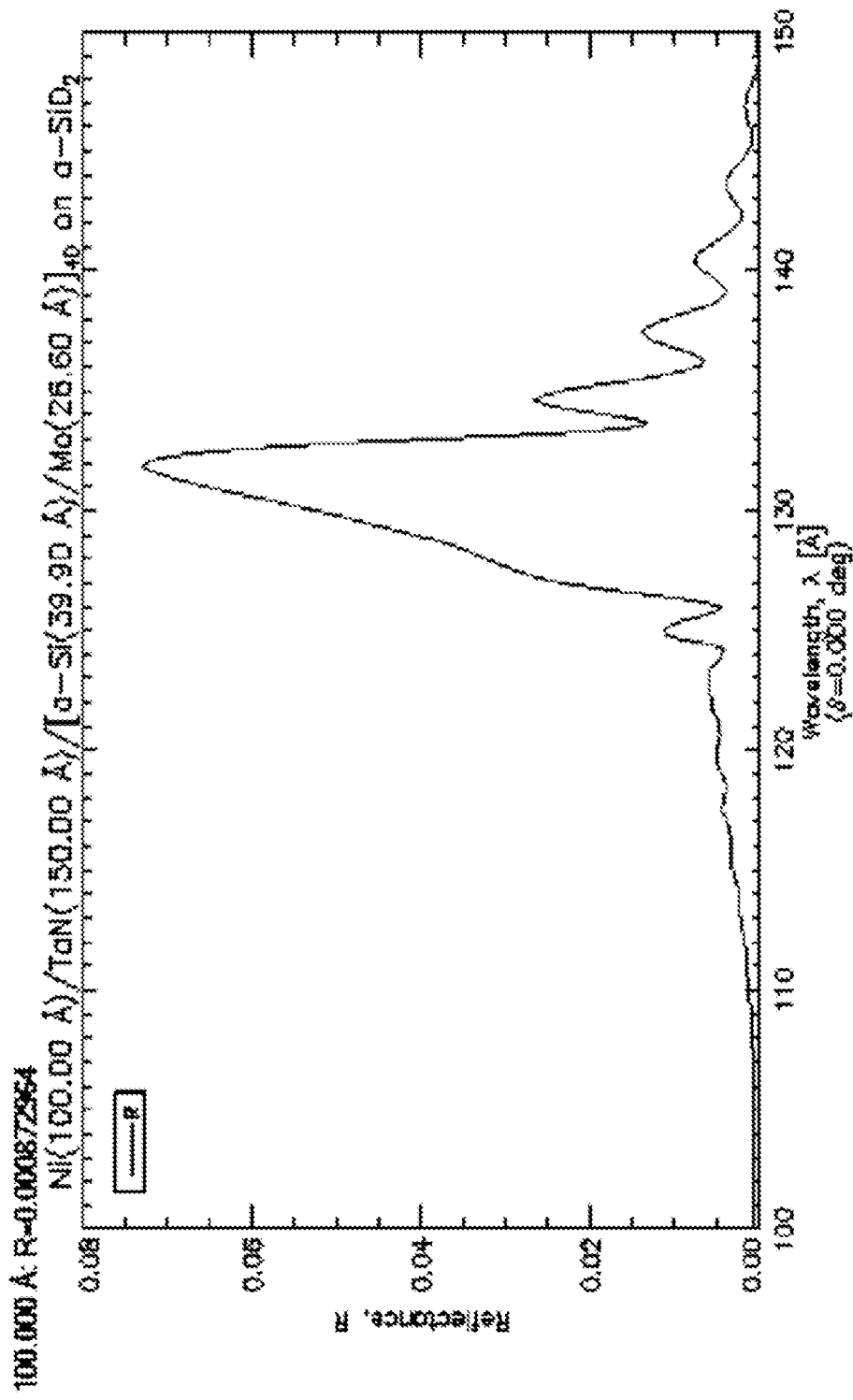
FIG. 6 is a reflectivity curve for a mask blank.
Figure 7:
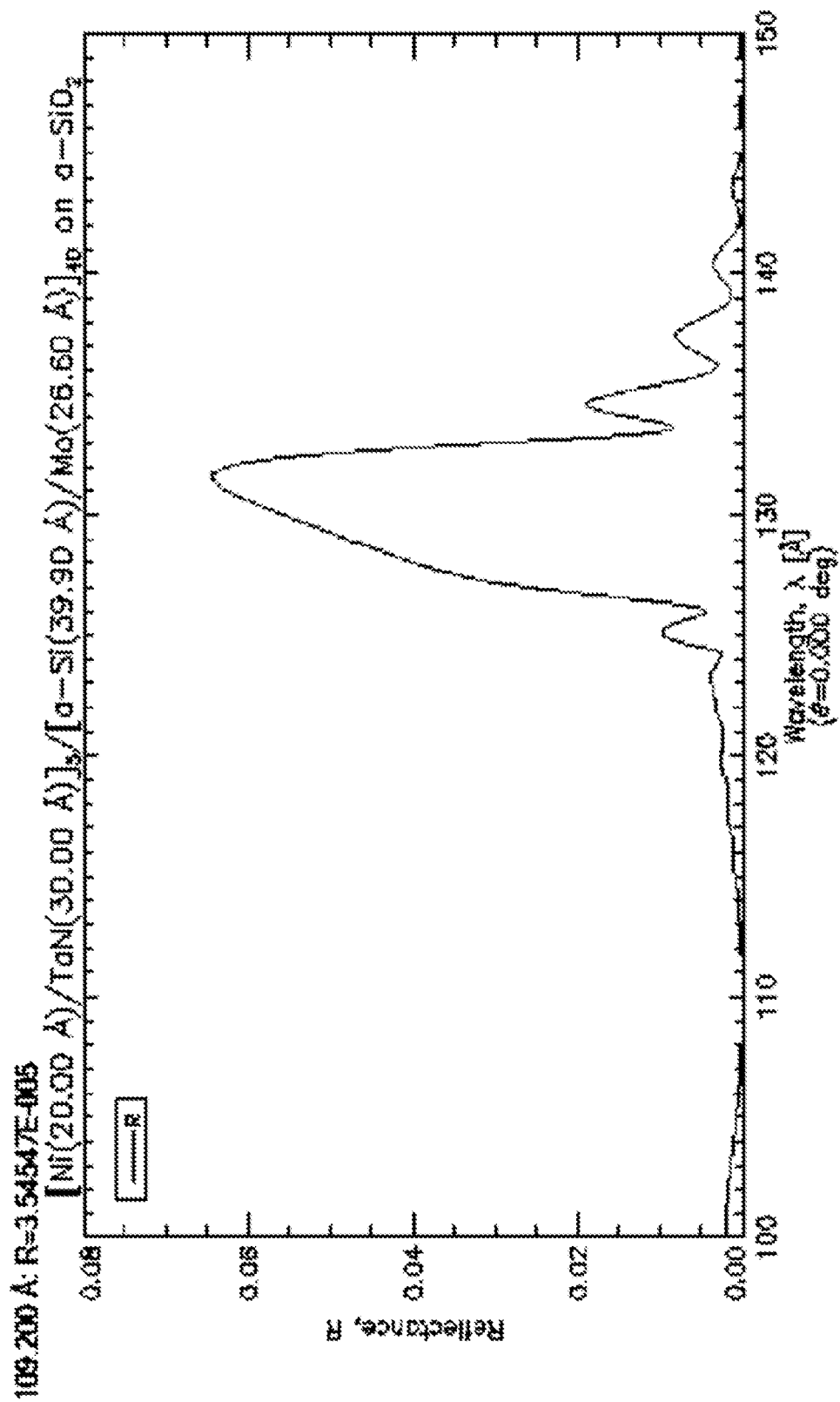
FIG. 7 is a reflectivity curve for a mask blank.

For example, consider a first case, an absorber stack of 10 nm Ni with 15 nm TaN on 40 ML of Mo and Si. The absorber stack will absorb EUV at 13.5 nm based on n and k of Ni and TaN. In a second case according to an embodiment, 5 bilayers of Ni and TaN of thickness 2 and 3 nm on top of 40 ML of Mo and Si can be made. In the second case, the light is not only absorbed by total thickness of 10 nm of Ni and 15 nm of TaN but additionally provides phase change of light which destructively interferes with reflected light from 40 ML of Mo and Si mirror providing enhanced contrast. Therefore, the second case stack will provide more than 50% improvement in the reflectivity loss. A gamma, which is a ratio of thickness of Ni with TaN, individual layer thickness and number of multilayers can be further optimized to provide even more contrast. FIG. 6 is a reflectivity curve for the first case and FIG. 7 is a reflectivity curve for the second case.

Another aspect of the disclosure pertains to a method of manufacturing an extreme ultraviolet (EUV) mask blank comprising providing a substrate, forming a multilayer stack of reflective layers on the substrate, the multilayer stack including a plurality of reflective layer pairs, forming a capping layer on the multilayer stack of reflective layers, and forming a multilayer stack of absorber layers on the capping layer, the multilayer stack of absorber layers including a plurality of absorber layer pairs, each pair comprising two different absorber materials having extinction coefficient (k) values that are different and index of refraction values (n) that are different. The EUV mask blank can have any of the characteristics of the embodiments described above with respect to FIG. 4 and FIG. 5, and the method can be performed in the system described with respect to FIG. 3.

Thus, in an embodiment, the plurality of reflective layers are selected from molybdenum (Mo) containing material and silicon (Si) containing material and the absorber layers are made from materials selected from the group consisting of platinum (Pt), zinc (Zn), gold (Au), nickel oxide (NiO), silver oxide ($Ag_2O$), iridium (Ir), iron (Fe), tin dioxide ($SnO_2$), cobalt (Co), chromium nickel alloys, $Ni_8Cr_2$, tin oxide (SnO), copper (Cu), silver (Ag), actinium (Ac), tellurium (Te), caesium iodide (CsI), tin (Sn), zinc telluride (ZnTe), antimony (Sb), tantalum (Ta), tantalum nitride (TaN), tantalum nitride oxide (TaNO), tantalum borate (TaBO). Alternatively, in an embodiment, the absorber layer pairs comprise a first layer including an made from a material selected from the group consisting of tantalum (Ta), tantalum nitride (TaN), tantalum nitride oxide (TaNO), tantalum borate (TaBO) and a second layer made from a material selected from the group consisting of platinum (Pt), zinc (Zn), gold (Au), nickel oxide (NiO), silver oxide ($Ag_2O$), iridium (Ir), iron (Fe), tin dioxide ($SnO_2$), cobalt (Co), chromium nickel alloys, in particular $Ni_8Cr_2$, tin oxide (SnO), copper (Cu), silver (Ag), actinium (Ac), tellurium (Te), caesium iodide (CsI), tin (Sn), zinc telluride (ZnTe), chromium (Cr), chromium nitride (CrN) and antimony (Sb). In a specific embodiment, an absorber layer pair comprises a first layer including an absorber material selected from tantalum nitride (TaN) and a second layer selected from nickel (Ni).

Figure 8:
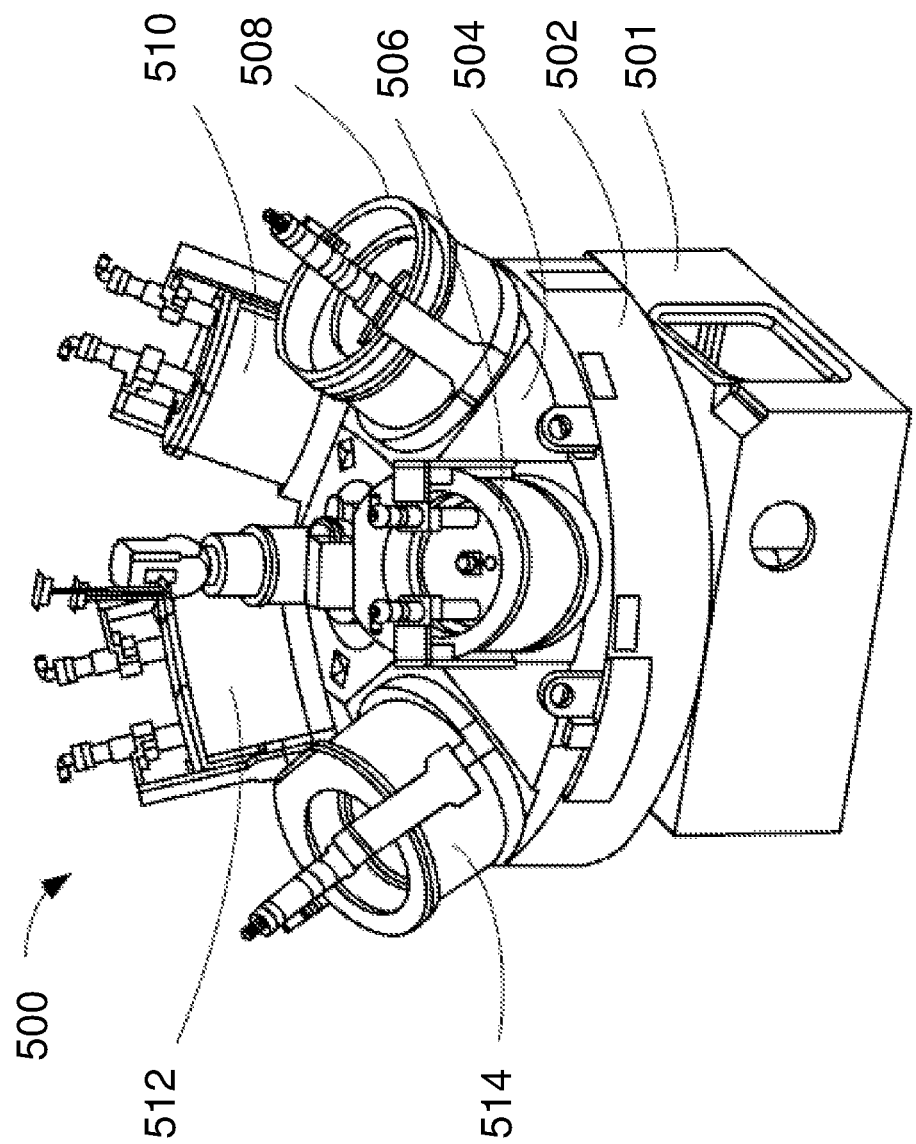
FIG. 8 illustrates an embodiment of a physical deposition chamber.

In another specific method embodiment, the different absorber layers are formed in a physical vapor deposition chamber having a first cathode comprising a first absorber material and a second cathode comprising a second absorber material. Referring now to FIG. 8 an upper portion of a multi-cathode source chamber 500 is shown in accordance with an embodiment. The first multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 204.

The multi-cathode source chamber 500 can be part of the system shown in FIG. 3. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, and multiple sub-chambers, accessed by the substrate handling platform, for forming an EUV mask blank, including a multilayer stack of reflective layers on the substrate, the multilayer stack including a plurality of reflective layer pairs, a capping layer on the multilayer stack reflective layers, and a multilayer stack of absorber layers on the capping layer, the multilayer stack of absorber layers including a plurality of absorber layer pairs, each pair comprising two different absorber materials having extinction coefficient (k) values that are different and index of refraction values (n) that are different. The system can be used to make the EUV mask blanks shown with respect to FIG. 4 or FIG. 5 and have any of the properties described with respect to the EUV mask blanks described with respect to FIG. 4 or FIG. 5 above.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank comprising:
forming a multilayer stack of reflective layers on a substrate, the multilayer stack of reflective layers including a plurality of reflective layer pairs;
forming a capping layer on the multilayer stack of reflective layers; and
forming a multilayer stack of absorber layers on the capping layer, the multilayer stack of absorber layers including a plurality of absorber layer pairs, each pair comprising two different absorber materials having extinction coefficient (k) values that are different and index of refraction values (n) that are different, wherein the absorber layer pairs comprise a first layer including an absorber material selected from tantalum nitride (TaN) and tantalum nitride oxide (TaNO), and a second layer including an absorber material selected from the group consisting of nickel oxide (NiO), tin dioxide ($SnO_2$), tin oxide (SnO), tin (Sn), tellurium (Te), and antimony (Sb).

2. The method of claim 1, wherein the first layer includes tantalum nitride (TaN).

3. The method of claim 1, wherein the first layer includes tantalum nitride oxide (TaNO).

4. The method of claim 1, wherein the second layer includes nickel oxide (NiO).

5. The method of claim 1, wherein the second layer is selected from the group consisting of tin dioxide ($SnO_2$), tin oxide (SnO), tin (Sn).

6. The method of claim 1, wherein the second layer includes tellurium (Te).

7. The method of claim 1, wherein the second layer includes antimony (Sb).

8. The method of claim 1, wherein the absorber layer pairs comprise a first absorber layer and a second absorber layer, each of the first absorber layer and the second absorber layer each having a thickness in a range of 1 nm and 5 nm.

9. The method of claim 1, wherein the different absorber materials and thickness of the absorber layers are selected so that extreme ultraviolet light is absorbed due to absorbance and due to a phase change caused by destructive interfere with light from the multilayer stack of reflective layers.

10. The method of claim 1, wherein the method comprises forming a range of from 5 to 60 absorber layer pairs.

11. An extreme ultraviolet (EUV) mask blank comprising:
a substrate;
a multilayer stack of reflective layers on the substrate, the multilayer stack of reflective layers including a plurality of reflective layers including reflective layer pairs;
a capping layer on the multilayer stack of reflecting layers; and
a multilayer stack of absorber layers on the capping layer, the multilayer stack of absorber layers including a plurality of absorber layer pairs, each pair comprising two different absorber materials having extinction coefficient (k) values that are different and index of refraction values (n) that are different, wherein the absorber layer pairs comprise a first layer including an absorber material selected from tantalum nitride (TaN) and tantalum nitride oxide (TaNO), and a second layer including an absorber material selected from the group consisting of nickel oxide (NiO), tin dioxide ($SnO_2$), tin oxide (SnO), tin (Sn), tellurium (Te), and antimony (Sb).

12. The EUV mask blank of claim 11, wherein the first layer includes tantalum nitride (TaN).

13. The EUV mask blank of claim 11, wherein the first layer includes tantalum nitride oxide (TaNO).

14. The EUV mask blank of claim 11, wherein the second layer includes nickel oxide (NiO).

15. The EUV mask blank of claim 11, wherein the second layer is selected from the group consisting of tin dioxide ($SnO_2$), tin oxide (SnO), tin (Sn).

16. The EUV mask blank of claim 11, wherein the second layer includes tellurium (Te).

17. The EUV mask blank of claim 11, wherein the second layer includes antimony (Sb).

18. The EUV mask blank of claim 11, wherein the absorber layer pairs comprise a first absorber layer and a second absorber layer, each of the first absorber layer and the second absorber layer each having a thickness in a range of 1 nm and 5 nm.

19. The EUV mask blank of claim 11, wherein the different absorber materials and thickness of the absorber layers are selected so that extreme ultraviolet light is absorbed due to absorbance and due to a phase change caused by destructive interfere with light from the multilayer stack of reflective layers.

20. The EUV mask blank of claim 11, comprising a range of from 5 to 60 absorber layer pairs.

* * * * *

UNITED STATES PATENT AND TRADEMARK OFFICE
CERTIFICATE OF CORRECTION

Page 1 of 1

PATENT NO. : 11,022,876 B2
APPLICATION NO. : 16/821444
DATED : June 1, 2021
INVENTOR(S) : Vibhu Jindal It is certified that error appears in the above-identified patent and that said Letters Patent is hereby corrected as shown below:

In the Specification

Column 4, Line 38, replace "of of" with "of"

Column 11, Line 8, replace "interfere with light" with "interference with light reflected"

Column 11, Line 27, insert --of-- after "multilayer stack"

In the Claims

Column 14, Claim 11, Line 11, replace "reflecting" with "reflective"

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*